United States Patent
Kakolaki et al.

(10) Patent No.: US 9,312,874 B1
(45) Date of Patent: Apr. 12, 2016

(54) ANALOG TO DIGITAL CONVERSION (ADC)/DIGITAL TO ANALOG CONVERSION (DAC) COMPRESSION

(71) Applicant: Apple Inc., Cupertino, CA (US)

(72) Inventors: Behrooz Karimian Kakolaki, San Jose, CA (US); Stephen R. Oakes, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/534,438

(22) Filed: Nov. 6, 2014

(51) Int. Cl.
*H03M 1/12* (2006.01)
(52) U.S. Cl.
CPC ................... *H03M 1/1245* (2013.01)
(58) Field of Classification Search
CPC ...................................................... H03M 1/245
USPC ................................ 341/110, 50, 51, 155, 87
See application file for complete search history.

(56) References Cited

U.S. PATENT DOCUMENTS

| | | | |
|---|---|---|---|
| 5,087,932 A * | 2/1992 | Chikano | B41J 29/02 346/145 |
| 6,054,943 A * | 4/2000 | Lawrence | H03M 7/3053 341/67 |
| 6,895,305 B2 | 5/2005 | Lathan et al. | |
| 7,071,852 B1 * | 7/2006 | Wegener | G01R 13/0272 341/144 |
| 7,486,205 B2 * | 2/2009 | Wegener | G01R 31/31921 341/50 |
| 7,876,252 B1 | 1/2011 | Wegener | |
| 2013/0162899 A1 | 6/2013 | Wu et al. | |
| 2013/0321181 A1 * | 12/2013 | Cheng | H03M 7/30 341/87 |

* cited by examiner

*Primary Examiner* — Peguy Jean Pierre
(74) *Attorney, Agent, or Firm* — Meyertons, Hood, Kivlin, Kowert & Goetzel, P.C.; Lawrence J. Merkel (57) ABSTRACT

In an embodiment, a system includes an ADC and a compression circuit associated with the ADC. The ADC may be configured to generate samples of an analog signal. The compression circuit may be configured to compress the samples for transmission to a receiving circuit that processes the signal based on the compressed samples. By transmitting compressed samples, the power consumed for transmitting the data to the receiving circuit may be reduced as compared to transmitting the uncompressed samples. The receiving circuit may also be coupled to a DAC and may be configured to transmit compressed samples to be applied to an actuator. A decompression circuit associated with the DAC may be configured to decompress the samples.

19 Claims, 7 Drawing Sheets

| DC Header/ Event 82 | DC Size Vector 84 | Complement Size Vector 86 | Handshake Event 88 |

| AC Header/ Event 92 | AC Pattern ID 94 | AC Pattern Value 96 | Handshake Event 98 |

| Event | D11 | D10 | D9 | D8 | D7 | D6 | D5 | D4 | D3 | D2 | D1 | D0 |
|---|---|---|---|---|---|---|---|---|---|---|---|---|
| 0 | NS | NS | NS | NS | NS | NS | NS | NS | NS | NS | SD1 | SD0 |
| 1 | ... | | | | | | 000000111111 | | | | | |
| 0 | NS | NS | NS | NS | NS | NS | SD5 | SD4 | SD3 | SD2 | SD1 | SD0 |
| 2 | ... | | | | | | AC ID/Pattern | | | | | |
| 0 | NS | NS | NS | NS | NS | NS | NS | NS | NS | NS | NS | NS |
| 1 | ... | | | | | | 000000001111 | | | | | |
| 0 | NS | NS | NS | NS | NS | NS | NS | NS | SD3 | SD2 | SD1 | SD0 |

ANALOG TO DIGITAL CONVERSION (ADC)/DIGITAL TO ANALOG CONVERSION (DAC) COMPRESSION

BACKGROUND

1. Technical Field

Embodiments described herein are related to analog to digital conversion (ADC), digital to analog conversion (DAC), and compression techniques for ADC/DAC.

2. Description of the Related Art

Various types of electronic systems include sensors that detect "real world" information and provide analog signals to the electronic systems representing the information. For example, temperature sensors can detect temperature in the system and/or the surrounding environment. Accelerometers can detect motion of the system through physical space. Any set of sensors can be used. Similarly, various actuators can be provided for the electronic system to interact with its environment. Actuators can include user interface devices (displays, lights, sound, etc.). Actuators can also include electrical control devices. Actuators can also include physical devices such as motors, levers, physical switches, etc.

The signals sensed by the sensors and the control data for the actuators is often analog in nature when sensed by the sensor or applied to the actuator. However, much of the electronic system is often digital. Accordingly, ADCs and DACs can be provided to convert the analog-sensed data to digital data and the digital control data to analog data. The ADCs generally quantize the analog data to one of a set of digital values, thus outputting a discrete sequence of samples of the analog signal at a specified sample rate. The DACs generally receive a discrete sequence of samples and generate a corresponding analog signal, implementing some form of interpolation to fill in data between the sample times to generate a continuous-time analog signal.

A given ADC or DAC implements a sample rate and samples are taken and transmitted at the sample rate regardless of the nature of the signal being sampled. Some signals are slow-changing compared to the sample rate, and thus redundant data is often transmitted from sample to sample. In other cases, a signal can be fast-changing at times, thus requiring a high sample rate, but can be slow-changing at other times. Power is consumed unnecessarily to transmit redundant data.

SUMMARY

In an embodiment, a system includes an ADC and a compression circuit associated with the ADC. The ADC may be configured to generate samples of an analog signal. The compression circuit may be configured to compress the samples for transmission to a receiving circuit that processes the signal based on the compressed samples. By transmitting compressed samples, the power consumed for transmitting the data to the receiving circuit may be reduced as compared to transmitting the uncompressed samples. The receiving circuit may also be coupled to a DAC and may be configured to transmit compressed samples to be applied to an actuator. A decompression circuit associated with the DAC may be configured to decompress the samples.

More particularly, in an embodiment, the compression circuit may be configured to dynamically modify a format of the compressed samples based on monitoring the series of samples generated by the ADC. For example, in one format, only some of the bits of the samples may be detected as varying from sample to sample. The format may exclude the unvarying bits. If different numbers of bits are detected as varying over time, the format may be changed to include or exclude more bits per sample. In another embodiment, the compression circuit may be configured to detect a repeating pattern in the stream of samples. The compression circuit may transmit an indication that the pattern has been detected along with a description of the pattern itself, and then my terminate transmission until the pattern is broken.

BRIEF DESCRIPTION OF THE DRAWINGS

The following detailed description makes reference to the accompanying drawings, which are now briefly described.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/ circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

Figure 1:
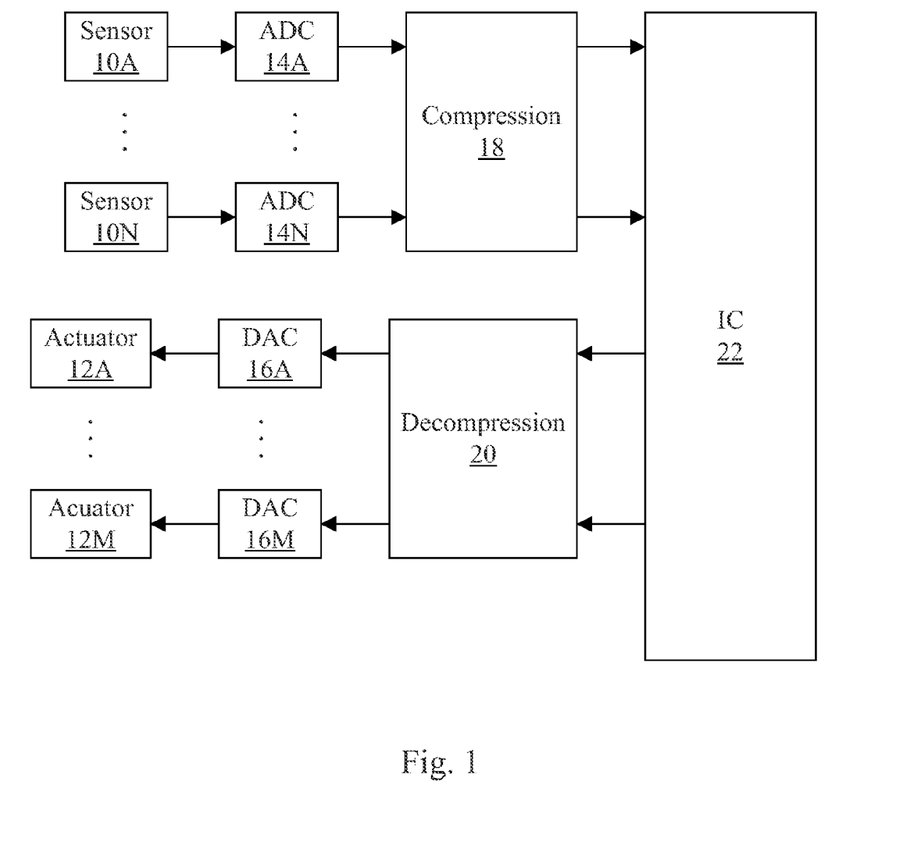
FIG. 1 is a block diagram of one embodiment of a system including sensors, ADCs, a compression circuit, an integrated circuit, a decompression circuit, DACs, and actuators.

Turning now to FIG. 1, a block diagram of one embodiment of a system is shown. In the illustrated embodiment, the system includes one or more analog sensors 10A-10N, one or more analog actuators 12A-12M, one or more ADCs 14A-14N coupled to respective sensors 10A-10N, one or more DACs 16A-16M coupled to respective actuators 12A-12M, a compression circuit 18 coupled to the ADCs 14A-14N, a decompression circuit 20 coupled to the DACs 16A-16M, and an integrated circuit (IC) 22 coupled to the compression circuit 18 and the decompression circuit 20.

Each sensor 10A-10N may be configured to detect/measure a value and provide an analog signal representing the value. For example, sensors may include temperature sensors, accelerometers, magnetometers, light sensors, audio sensors, motion detectors, power supply voltage sensors for various power supply voltages in an electronic system under observation (e.g. "power rails"), battery voltages and/or charge levels in a mobile electronic device that operates from the battery, etc. The analog signals are received by the corresponding ADCs 14A-14N, which convert them to digital signals. The digital signals may be a series of samples taken from the analog signals at a specified sample rate. Thus, the digital signals may be discrete value, discrete time signals. That is, each sample may represent the value of the analog signal at a given point in time, within the resolution of the quantization implemented by the ADC.

The compression circuit 18 is coupled to the ADCs 14A-14N, and may be configured to compress each digital signal to a corresponding compressed digital signal. Any type of compression mechanism or combination of compression mechanisms may be used. A compression mechanism may transmit the compressed samples according to a particular format, and the compression circuit may communicate the format to the receiving circuitry (e.g. the IC 22 in this case) as part of the compressed digital signal. That is, the compressed digital signal may include compressed samples as well as format change indications. The compression circuit may dynamically modify the format based on monitoring the series of samples, and may communicate the format change and change to the new format in response.

For example, in an embodiment, the compression circuit 18 may implement a first type of compression referred to herein as direct current (DC) compression. In the DC compression mechanism, the compression circuit 18 may detect that the series of samples includes some bits that are in a constant state. For example, a slowly-changing signal may quantize to sample values that are near each other, and thus some of the most significant bits may change infrequently. Bits that are constant over a period of time may be transmitted once, and then not transmitted until the bits change again. The bits that are constant may be sent initially, and then those bits may be omitted from subsequent transmissions unless a change is detected. That is, the format may exclude the bits that are invariant in the current series of samples. If a change in the excluded bits is detected, the format may be changed to include the changing bits. If fewer bits are detected as changing, the format may be changed to exclude additional invariant bits.

In an embodiment, the compression circuit 18 may implement a second type of compression, referred to herein as alternating current (AC) compression. In the AC compression mechanism, the compression circuit 18 may detect a repeating pattern in a series of consecutive samples. The pattern may be identified and transmitted, and then transmission may terminate until the pattern is no longer detected. That is, when the series of samples fails to repeat the pattern (the pattern is "broken"), the compression circuit 18 may being transmitting patterns again. Some embodiments may implement both AC and DC compression.

The form of transmission termination may vary depending on the interface between the compression circuit 18 and the receiving circuit (e.g. the IC 22 in FIG. 1). For example, transmission termination may include stopping any transmission on the interface. Alternatively, termination may include transmitting idle symbols, or holding the bits on the interface constant.

The decompression circuit 20 may be configured to receive compressed digital signals from the integrated circuit 22, and may decompress the digital signals to provide uncompressed digital signals to the DACs 16A-16M. The decompression circuit 20 may support compression mechanisms similar to the compression circuit 18. The IC 22 may generate the compressed digital signals for the actuators 12A-12M, and may provide the compressed signals to the decompression circuit 20.

The actuators 12A-12M may include any desired set of devices. For example, actuators may include user interface indicators such as light emitting devices, displays, audio devices such as speakers, light emitting diode (LED) drivers, display backlights, etc. The actuators may also include various analog circuits such as, e.g., power management circuits that control voltage regulators to supply power to the system. More particularly, an actuator may driver a power feedback point in the power management circuit to feedback power consumed, allowing the power management circuit to react to conditions in the system. Actuators may also include physical devices such as motors, levers, physical switches, etc.

The integrated circuit 22 may include any circuitry desired for the system, and may include circuitry to decompress the compressed digital signals from the compression circuit 18 and to process the decompressed samples. The IC 22 may include, e.g., a system on a chip (SOC) including one or more processors that execute software to process the samples. The IC 22 may include fixed function circuitry, and/or may be programmable function circuitry such as a field programmable gate array (FPGA). The IC 22 may also include circuitry to generate data for the actuators 12A-12M. The data may be compressed digital signals to be decompressed and converted to analog signals for the actuators 12A-12M.

Various embodiments of the system may include at least one sensor 10A-10N, and may include any number of sensors as desired. Some embodiments may include at least one actuator 12A-12M, and may include any number of actuators. The number of actuators may differ from the number of sensors. Generally, the compression circuit 18 and decompression circuit 20 may be scalable based on the size of the IC 22, and the number and/or bandwidth of the analog sensors and actuators being targeted. Various implementations may include a handheld device, a data acquisition system, a semi-custom or custom design, or a computer such as a laptop or desktop.

Figure 2:
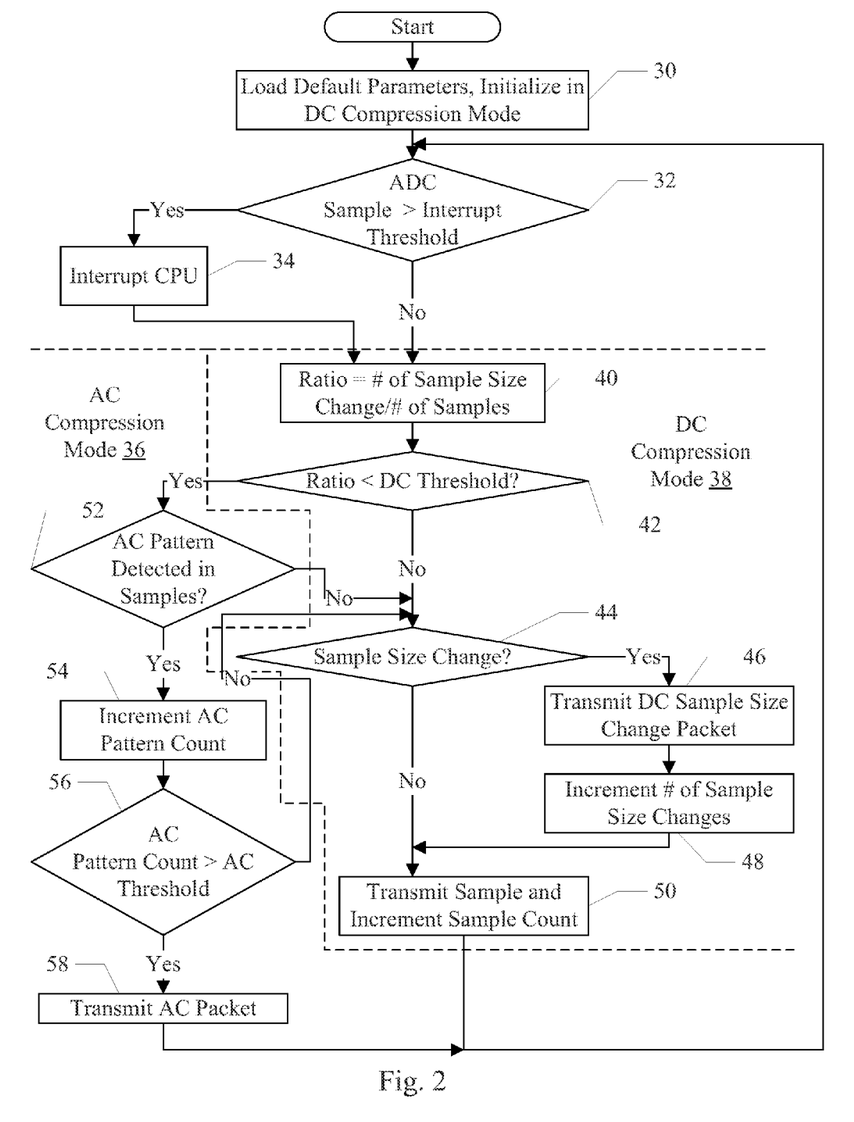
FIG. 2 is a flowchart illustrating operation of one embodiment of a compression circuit.

FIG. 2 is a flowchart illustrating operation of one embodiment of the compression circuit 18. While the blocks are shown in a particular order for ease of understanding, other orders may be used. Blocks may be performed in parallel in combinatorial logic in the compression circuit 18. Blocks, combinations of blocks, and/or the flowchart as a whole may be pipelined over multiple clock cycles. The compression circuit 18 may be configured to implement the operation illustrated in FIG. 2.

At boot up of the system, the compression circuit 18 may be configured to load default parameters and initialize operation in the DC compression mode (block 30). The default parameters may be written to the compression circuit 18 (e.g. by a processor in the IC 22), may be loaded from a non-volatile memory in the system by the compression circuit 18 or a processor which writes the parameters to the compression circuit 18, or may be hard coded in the compression circuit 18. Generally, the parameters may include the various thresholds described below, as well as any other programmable or dynamically variable data that controls the compression operation implemented by the compression circuit 18. For example, the parameters may include AC patterns to be matched to detect AC compression. The remainder of the flowchart in FIG. 2 may be iterated for each sample from the corresponding ADC 14A-14N. Similar operation may be performed for samples from each ADC 14A-14N, independent from each other ADC 14A-14N. Compression for different ADCs may be different (e.g. the compression may be in different modes, different numbers of bits being transmitted, etc.).

In some embodiments, one or more of the sensors being monitored may have an interrupt threshold associated with it. For example, if a sensor is monitoring temperature, a temperature threshold near the maximum acceptable temperature in the system may be defined. If the temperature reaches this threshold, the system may take rapid action to reduce the temperature. The rapid action may be initiated by interrupt a processor on the IC 22 to analyze the sample data as well as other system information to determine the steps to take to reduce the temperature, for example. If the sample exceeds the threshold (decision block 32, "yes" leg), the compression circuit 18 may transmit an interrupt to the processor (block 34). In either case, processing of the sample by the compression circuit 18 may be continued. While the illustrated embodiment illustrates a sample exceeding a threshold, other embodiments may have thresholds for the minimum acceptable value of a sample, or both types of thresholds may be implemented. It is noted that the interrupt threshold is optional and may not be implemented in some embodiments. Embodiments that do not implement the interrupt threshold may omit blocks 32 and 34.

The remainder of the flowchart in FIG. 2 is divided into sections by horizontal and vertical dashed lines. Blocks below the horizontal line and to the left of the vertical line may be part of the AC compression mode 36. Blocks below the horizontal line and to the right of the vertical line may be part of the DC compression mode 38. As mentioned above, initially the compression circuit may be in DC compression mode 38.

One of the parameters implemented by the compression circuit 18 may be a DC threshold. The DC threshold may be measured as a ratio of the number of sample size changes that have been made in DC compression mode to the number of samples that have been processed. A sample size change may be a change to the format of the DC compressed data transmissions, sending more or fewer bits because the number of changing bits within the series of samples has changed. Therefore, a ratio of one would indicate that the format is changing with every sample, and a ratio of zero would indicate that the format has not changed over many samples. The compression circuit 18 may be configured to compute the ratio (block 40) and may compare the ratio to the DC threshold. If the ratio is less than the DC threshold, the format is not being changed very frequently and thus the monitored signal may be a relatively slow-changing signal. If the ratio is greater than the DC threshold, frequent changes are being made to the format and thus the signal may be more quickly-changing. AC compression may not be desirable to attempt on quickly-changing signals. Accordingly, if the ratio is greater than the DC threshold (decision block 42, "no" leg), and a sample size change is detected because a previously unchanging bit has been detected as changing by the compression circuit 18 or vice versa (decision block 44, "yes" leg), the compression circuit 18 may be configured to transmit a DC sample size change packet to the receiver, changing the format of the DC compressed samples (block 46). The compression circuit 18 may be configured to increment the number of sample size changes as well (block 48). The compression circuit 18 may be configured to transmit the sample, excluding the unchanging bits according to the current DC compression format, and may be configured to increment the sample count (block 50). If no sample size change is detected (decision block 44, "no") leg, the compression circuit 18 may still transmit the sample and increment the sample count (block 50).

If the ratio is less than the DC threshold (decision block 42, "yes" leg), the compression circuit 18 may be configured to determine if a switch to AC compression mode 36 is desirable. The compression circuit 18 may retain the P most recent samples, where P is an integer determined from the pattern size that the compression circuit 18 is configured to match against. The compression circuit 18 may compare the P most recent samples to the pattern(s), and if a matching AC pattern is not detected then the compression circuit 18 may remain in DC compression mode 38 (decision block 52, "no" leg). On the other hand, if one of the AC patterns is matched (decision block 52, "yes" leg), the compression circuit may be configured to increment an AC pattern count (block 54). The AC pattern count may be cleared if a mismatch is detected. If the AC pattern count is greater than an AC threshold (decision block 56, "yes" leg), transition to AC compression mode 36 has been detected. The compression circuit 18 may be configured to transmit an AC packet identifying the detected pattern, and may terminate sample transmission until the AC pattern is broken (block 58). The detection of the broken pattern may occur at decision block 52, for example, in response to subsequent samples. If the AC pattern count is not great than the AC threshold (decision block 56, "no" leg), the compression circuit 18 may remain in DC compression mode 38.

The decompression circuit 20 may be configured to receive DC compressed and AC compressed samples generated according to the scheme shown in FIG. 2 by the IC 22. Similarly, the IC 22 may include decompression circuitry configured to decompressed the compressed samples from the compression circuit 18. In both cases, the decompression circuitry may receive an initial sample and may retain the bits that are not changing (as indicated by the DC sample size change packet), filling in those bits for the subsequent samples to decompress them. The decompression circuitry may also receive the AC packet and may capture the pattern of samples, and may repeat the pattern of samples as received samples until a DC sample size change packet is received indicating that the pattern has been broken.

Figure 3:
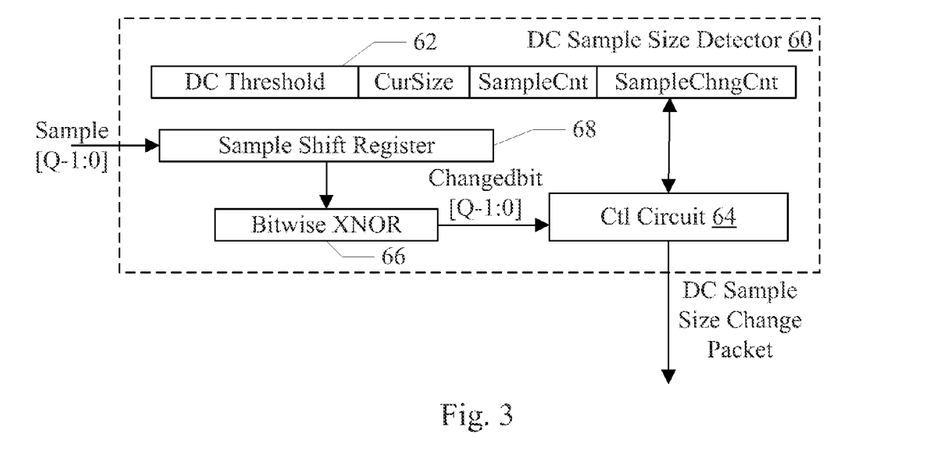
FIG. 3 is a block diagram of one embodiment of a DC sample size detector.

FIG. 3 is a block diagram of one embodiment of a DC sample size detector circuit 60 that may be used in one embodiment of the compression circuit 18. In the illustrated embodiment, the DC sample size detector circuit 60 includes a control register 62, a control circuit 64 coupled to the control register 62, a bitwise exclusive NOR (XNOR) circuit 66 coupled to the control circuit 64, and a sample shift register 68 coupled to the bitwise XNOR circuit 66 and to receive samples from one of the ADCs 14A-14N.

The sample shift register 68 may be configured to accumulate the most recent samples, shifting a newly-received sample in and shifting out the oldest sample in the register 68. The sample may be Q bits, with the most significant bit labeled Q-1 and the least significant bit labeled 0 in FIG. 3. The bitwise XNOR circuit 66 may be configured to XNOR the corresponding bits of each sample, detecting which bits have changed over the samples. The output of the bitwise XNOR circuit 66 may thus be a vector of bits (Changedbit [Q-1:0] in FIG. 3). The vector of bits may include one bit for each bit position of the samples, where a set bit in a given position indicates that the corresponding bit position in the sample has changed at least once over the samples in the sample shift register 6, for example.

The control circuit 64 may be configured to detect the most significant bit that has changed from the output of the bitwise XNOR circuit 66, and may determine the sample size that is needed to accurately transmit the samples. The determined sample size may be compared to the current size in effect on the interface to the integrated circuit 22 (e.g. as indicated in the CurSize field of the control register 62), and may generate a DC sample size change packet if the sample size is to be changed. The new sample size may also be captured in the CurSize field of the control register 62. The control circuit 62 may be configured to maintain the sample count (SampleCnt field of the control register 62) and the sample change count (SampleChngCnt field in the control register 62). In addition, in some embodiments, the control register 62 may include the DC Threshold and the control circuit 64 may be configured to determine the ratio of the sample change count to the sample count and to compare the ratio to the DC threshold to detect if AC compression may be attempted.

Sample size changes may be detected in either direction (increase or decrease). That is, if the bitwise XNOR circuit 66 detects a bit changing in the samples that is not currently being transmitted at the current sample size, the sample size may be increased to permit transmission of the newly-changing bit. On the other hand, if a bit that was previously changing is no longer changing, the sample size may be decreased and that non-changing bit may be excluded from sample transmission.

The number of samples maintained in the sample shift register 68 may vary from embodiment to embodiment. Generally, considering more samples in detecting changing/non-changing bits may lead to more accurate sample size detection and less frequent sample size changes. On the other hand, considering more samples may make the DC sample size detector circuit 60 react more slowly to unchanging bits, as they need to be unchanging in all samples before detection.

While a bitwise XNOR is used to detect changes in samples in the illustrated embodiment, any circuitry for comparing the samples and identifying bits that change may be used. Any Boolean equivalents of the bitwise XNOR circuit may be used as well.

Figure 4:
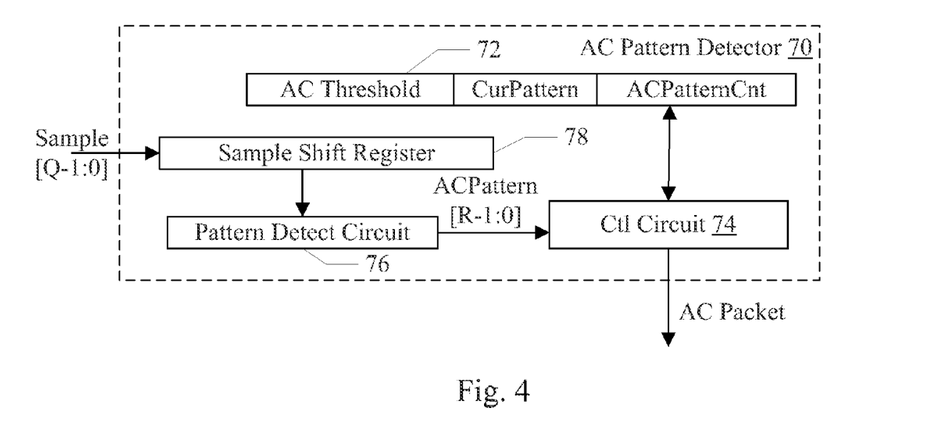
FIG. 4 is a block diagram of one embodiment of an AC pattern detector.

FIG. 4 is a block diagram of one embodiment of an AC pattern detector circuit 70 that may be used in one embodiment of the compression circuit 18. In the illustrated embodiment, the AC pattern detector circuit 70 includes a control register 72, a control circuit 74 coupled to the control register 72, a pattern detect circuit 76 coupled to the control circuit 74, and a sample shift register 78 coupled to the pattern detect circuit 76 and to receive samples from one of the ADCs 14A-14N. The sample shift register 78 may be separate from the sample shift register 68, or a shift register may be shared between the circuits 60 and 70.

Similar to the discussion above with regard to FIG. 3, the sample shift register 78 may be configured to accumulate the most recent samples, shifting a newly-received sample in and shifting out the oldest sample in the register 78. The pattern detect circuit 76 may be configured to compare the samples to one or more predetermined patterns. The patterns may be hard-coded in the circuit 76, or may be programmable in a table or other programmable storage in the circuit 76. Any number of patterns may be supported. If a pattern is detected, the pattern detect circuit 76 may be configured to transmit a pattern identifier to the control circuit 74 (ACPattern[R-1:0]). The control circuit 74 may be configured to determine if the detected pattern is different from the current pattern (CurPattern field in the register 72). If the pattern is different from the current pattern, the control circuit 74 may be configured to clear the AC pattern count (ACPatternCnt field in the register 72) and record the newly-detected pattern in the CurPattern field. If the pattern is the same as the current pattern, the control circuit 74 may be configured to increment the AC pattern count and, if the AC pattern count is greater than the AC threshold and the AC packet has not yet been transmitted, the control circuit 74 may be configured to transmit the AC packet.

Figure 5:
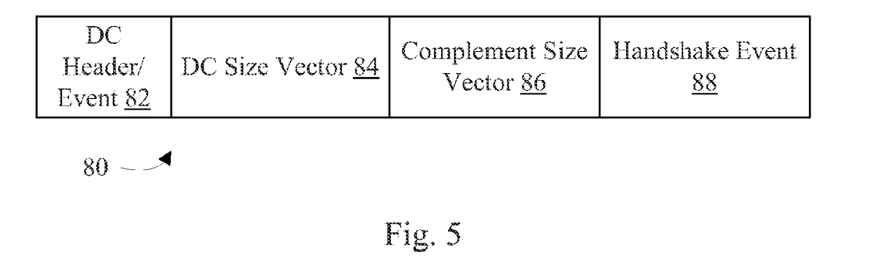
FIG. 5 is a block diagram of one embodiment of a DC sample size change packet.

FIG. 5 is a block diagram of one embodiment of DC sample size change packet 80. The DC sample size change packet 80 may include a DC header or event indicator 82, a DC size vector 84, a complement size vector 86, and a handshake event 88.

The format of the packet 80 may vary based on the type of interconnect between the compression circuit 18 and the IC 22 (and between the IC 22 and the decompression circuit 20). Packet interfaces such as Inter-Integrated Circuit (I$^2$C) may include a packet header for the DC header or event indictor 82, and the packet header may be coded differently than other headers to identify the packet. On the other hand, bus-based interfaces may use an event indicator such as a chip select signal or the like to signal that a DC sample size change packet 80 is being transmitted (e.g. as opposed to data).

The DC size vector 84 may be a vector of bits corresponding to the number of bits in a sample, and each bit may be set to indicate that the corresponding bit is transmitted at the new sample size and clear to indicate that the corresponding bit is not transmitted at the new sample size. In other embodiments, the opposite assignment of set and clear states may be used. In still other embodiments, other indications of the size may be used (e.g. the size vector may be a number of bits instead of a vector). The complement size vector 86 may be a complement of the vector 84, for error detection purposes in the transmission. In some embodiments, the complement size field 84 may be eliminated.

The handshake event 88 may vary based on the interface definition as well. For example, the handshake event 88 may be a trailer for a packet-based interface, indicating termination of the packet. The handshake event 88 may be a signal or combination of signals indicating termination of the packet and success/failure of the packet transmission from the receiving device. In other embodiments, the handshake event 88 need not be included.

The DC sample size change packet 80 shown in FIG. 5 is merely one example, and other embodiments may implement any packet/communication to change the sample size.

Figure 6:
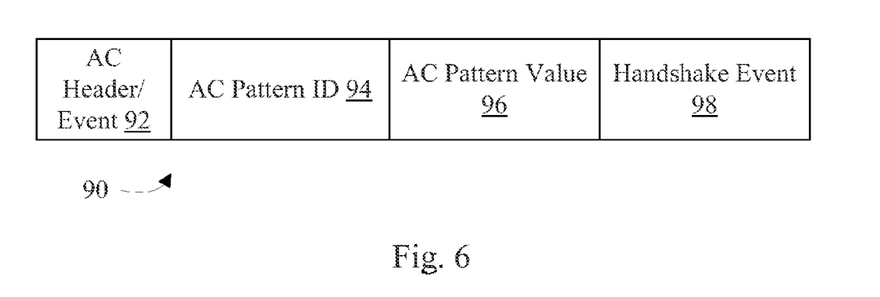
FIG. 6 is a block diagram of one embodiment of an AC packet.

FIG. 6 is a block diagram of one embodiment of AC packet 90. The AC packet 90 may include an AC header or event indicator 92, an AC pattern ID 94, an AC pattern value 96, and a handshake event 98.

Similar to the discussion of the header/event indicator 82 and handshake event 88 above with regard to the DC sample size change packet 80, the header/event indicator 92 may identify the AC packet 90 and the handshake event 98 may indicate the end of the AC packet 90. The handshake event 98 may be optional and may be eliminated in other embodiments.

The AC pattern ID field 94 may indicate which AC pattern has been detected. The compression circuit 18 may be configured to detect a number of patterns, and the AC pattern ID field 94 may uniquely identify which pattern has been detected. In an embodiment in which the compression circuit 18 is hard-coded to detect certain patterns, the AC pattern ID field 94 may identify one of the hard-coded patterns. In an embodiment in which the compression circuit 18 is programmable with patterns to detect (e.g. a table of patterns), the AC pattern ID field 94 may indicate which programmable storage is storing the pattern (e.g. which table entry).

The AC pattern field 96 may be an initial value of the detected pattern. That is, a given pattern may be detected at any point in the pattern. Taking a one bit value as a simple example, a pattern of two highs and two lows may be detected as two highs followed by two lows, a high followed by two lows and a high, two lows followed by two highs, or a low followed by two highs and a low. The receiving circuitry may repeat the initial value as indicated in the AC pattern field 96 until a DC size change packet 80 is transmitted to indicate a return to DC compression mode from AC compression mode. In another embodiment, the compression circuit 18 may be configured to wait until the repeating pattern reaches a predetermined point so that the initial value of the pattern is the same each time it is detected. In such an embodiment, the AC pattern field 96 may be eliminated.

The AC packet 90 shown in FIG. 6 is merely one example, and other embodiments may implement any packet/communication to indicate AC compression.

Figure 7:
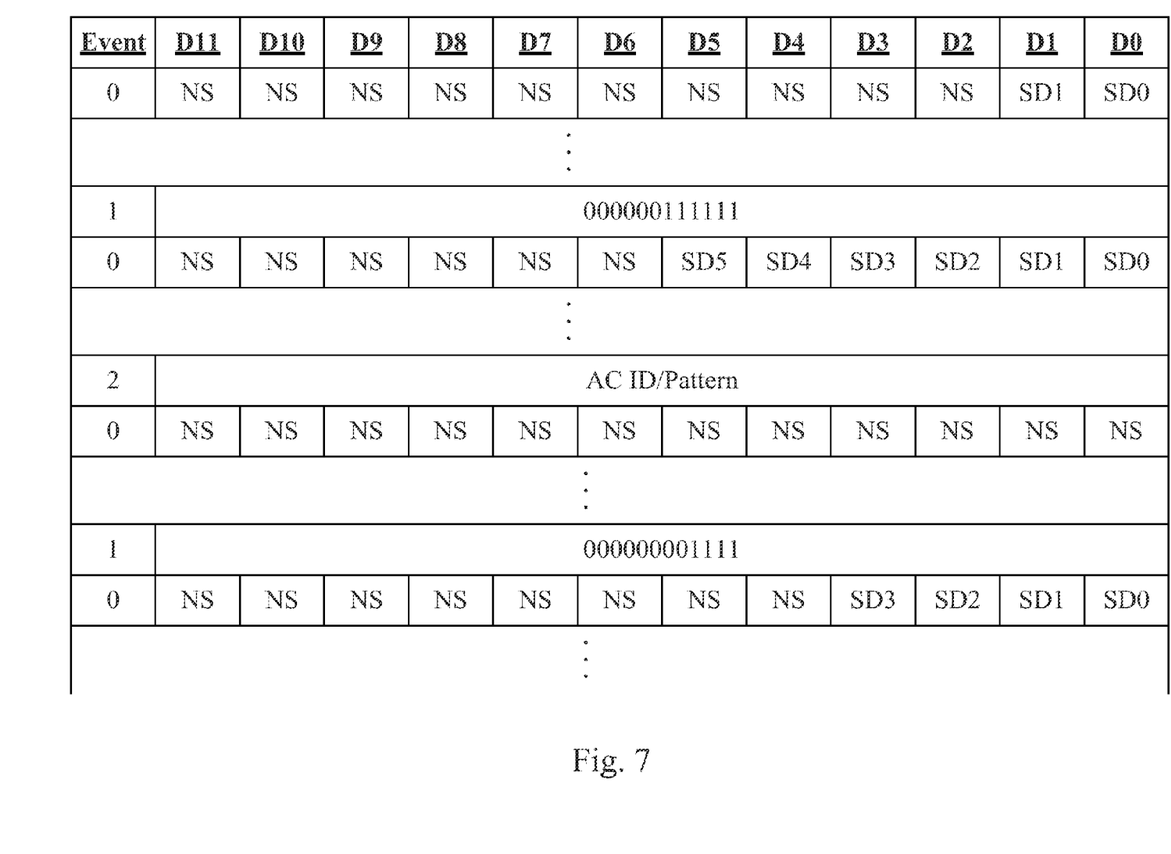
FIG. 7 is an example of compressed sample data transfer to the integrated circuit shown in FIG. 1.

FIG. 7 is an example of DC compression mode and AC compression mode on an interface that includes the event/header (Event column in FIG. 7) and 12 data bits (indicated as D11 to D0 in FIG. 7). In this example, an event of "0" indicates that data is being transmitted, an event of "1" indicates a DC sample size change packet, and an event of "2" indicates an AC packet. Bits indicated as NS are not sent (not transmitted).

Initially, the compression circuit 18 is in DC compression mode with a sample size of two bits. Accordingly, data packets are transmitted with only D1 and D0 active (SD1 and SD0). The "not sent" bits D11 to D2 may not be transmitted, which may save power over multiple sample transmissions. Subsequently, an event of 1 indicates a sample size change packet increases the sample sizes to 6 bits (size vector of 000000111111). Subsequent data packets that include sent data on D5 to D0 (SD5 to SD0) are transmitted.

An AC pattern is detected and transition to a AC compression mode is performed, transmitting an AC packet (event of "2") indicating detected pattern ID and initial pattern. Subsequently, transmission ceases (all bits not sent, or NS, in FIG. 7). At a later point, the AC pattern is broken and a DC sample size packet indicating 4 bits is transmitted.

Figure 8:
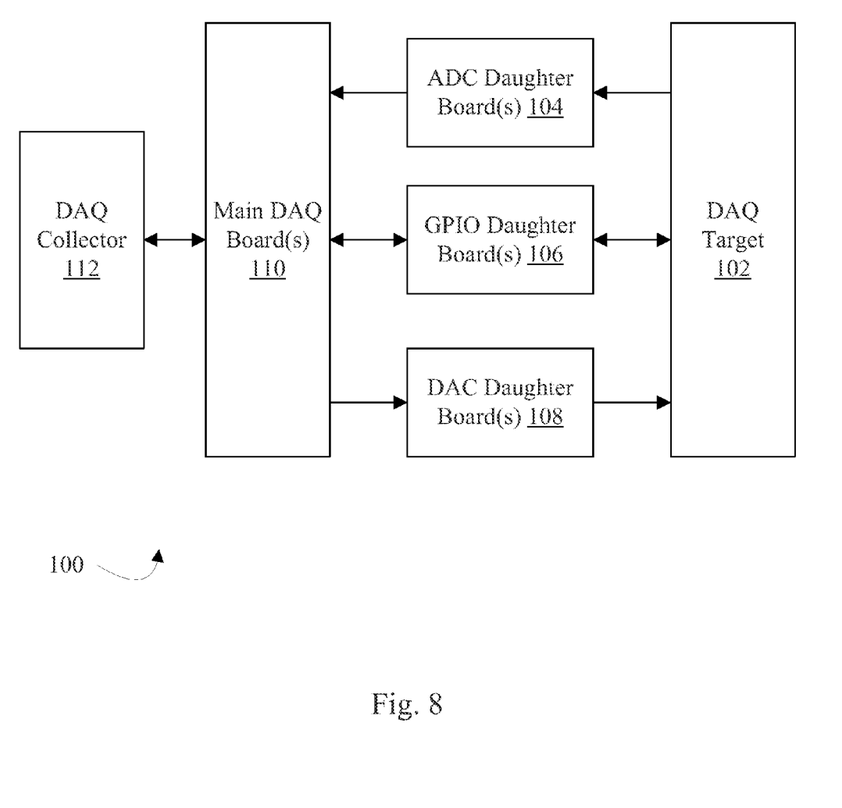
FIG. 8 is a block diagram of one embodiment of a data acquisition (DAQ) system including an embodiment of the system in claim 1.

FIG. 8 is a block diagram of one embodiment of a data acquisition (DAQ) system 100 that may implement the sample compression scheme described above in an embodiment. In the illustrated embodiment, the DAQ system 100 includes a DAQ target 102, one or more ADC daughter boards 104, one or more GPIO daughter boards 106, one or more DAC daughter boards 108, one or more main DAQ boards 110, and a DAQ collector 112. The DAQ target 102 is coupled to the boards 104, 106, and 108, which are coupled to the main DAQ boards 110, which are further coupled to the DAQ collector 112.

The DAQ target 102 may be the device that is under observation/control in the DAQ system 100. The DAQ target 102 may be a physical device of any type, and need not be an electronic device. If the DAQ target is an electronic device, it may be of any type. For example, the device may be a mobile device such as cell phone, a smart phone, a tablet computer, a laptop computer, etc. The device may be a desktop or other less mobile computing device, or any other electronic device.

Any set of parameters may be monitored using various types of sensors, which may produce analog electrical values indicating the measurement (e.g. analog voltages, currents, etc.). Each sensor may be coupled to a corresponding ADC on one of the ADC daughter boards 104, which may sample the analog measurements and provide a series of digital samples to the main DAQ board(s) 110. The main DAQ boards 110 may compress the samples using the above compression scheme, and transmit the samples to the DAQ collector 112.

The DAQ collector 112 may be any type of digital computing device (mobile or fixed location) that may record the samples and process the samples. In embodiments in which the DAQ target 102 includes actuators that are controllable from the DAQ system 100, the DAQ collector 112 may also be configured to generate the samples representing the control signals and may compress them for transmission to the main DAQ boards 110. The main DAQ boards 110 may decompress the samples and transmit them to the DAC daughter boards 108, which may convert the samples into an analog control signal. The DAC daughter boards 108 may transmit the analog signals to the actuators in the DAQ target 102.

In some embodiments, digital outputs of the DAQ target 102 may be observed by the DAQ system 100 and digital inputs to the DAQ target 102 may be controlled by the DAQ system 100. GPIO daughter boards 106 may be used to capture and transmit digital inputs and outputs. Embodiments that do not have digital inputs and outputs may not include the GPIO daughter boards 106.

The main boards 110 with daughter boards 104, 106, and 108 which may be inserted into connectors on the main boards 110 may provide a flexible configurable building block system for the DAQ system 100. The ADCs and DACs included in the system may be selected independently based on the desired bandwidth, accuracy, and other characteristics as well as cost considerations. Any mix of various types and ADCs and/or DACs may be used.

Figure 9:
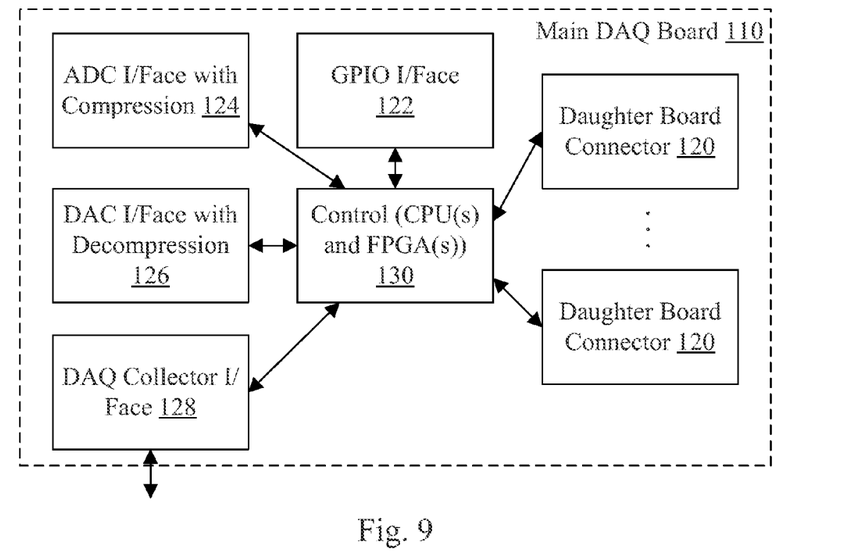
FIG. 9 is a block diagram of one embodiment of a main DAQ board.

FIG. 9 is a block diagram of an embodiment of a main DAQ board 110. If more than one main DAQ board 110 is used, each main DAQ board 110 may be similar. In the illustrated embodiment, multiple daughter board connectors 120 may be included for connecting daughter boards 104, 106, and/or 108. A GPIO interface circuit 122, an ADC interface circuit 124, a DAC interface circuit 126, and a DAQ collector interface circuit 128, and a control circuit 130 may be included. The circuits 122, 124, 126, and 128, and the connectors 120, may be coupled to the control circuit 130.

The control circuit 130 may include the logic for controlling operation of the various circuits 122-128 and the ADCs/DACs/GPIOs on the daughter boards to acquire the desired data from the DAQ target 102 and to provide control to the DAQ target 102. For flexibility, in an embodiment, the control circuit 130 may include one or more FPGAs, and the FPGAs may be download data to implement logic for the desired operation. In an embodiment, the FPGA may include a hardened CPU that may execute software as part of the control. Alternatively, a soft CPU may be downloaded into the FPGA logic array along with various soft logic programming for the various logic functions. Any combination of hard or soft CPU and logic circuitry may be used to implement the control circuit 130.

The DAQ collector interface 128 may control communication to/from the DAQ collector 112. A system packet interface (SPI) may be used to communicate with the DAQ collector 112, or any other interface may be used. Similarly, any desired interface may be used for the DAC interface circuit 126, the ADC interface circuit 124, and/or the GPIO interface circuit 122, including SPI for example. The ADC interface circuit 124 may implement compression similar to the compression unit 18; and the DAC interface circuit 126 may implement decompression similar to the decompression circuit 20.

Figure 10:
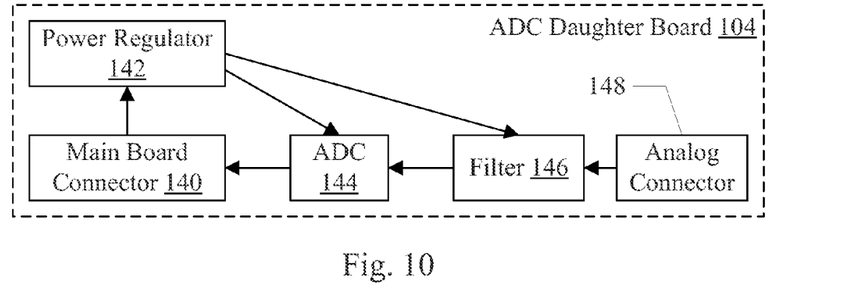
FIG. 10 is a block diagram of one embodiment of an ADC daughter board.

FIG. 10 is a block diagram of one embodiment of an ADC daughter board 104. In the illustrated embodiment, the daughter board 104 may include a main board connector 140, a power regulator 142, an ADC 144, a filter 146, and an analog connector 148. The main board connector 140 is coupled to the power regulator 142 and the ADC 144. The power regulator 142 is coupled to the ADC 144 and the filter 146. The filter 146 is coupled to the ADC 144 and the analog connector 148.

The analog connector 148 may be configured to connect to a sensor in the DAQ target 102. An analog cable may be used, e.g., between the analog connector 148 and the sensor. The input analog signal may be passed through the filter 146, which may be configured to filter noise components from the signal. The filtered input signal may be input to the ADC 144, which may be configured to sample the input signal and provide a series of digital samples to the main DAQ board through the main board connector 140.

The main board connector 140 may be configured to connect to a daughter board connector 120 in the main board 110. For example, the main board connector 140 may be a printed circuit board card edge configured to insert into a daughter board connector 120. Any types of connectors may be used.

The power regulator 142 may be configured to receive power from the main board 110 through the main board connector 140, and may be configured to generate a regulated power supply voltage for the ADC 144 and the filter 146.

Different instances of the ADC daughter board 104 may have different ADCs 144 (e.g. ADCs with different price points and other characteristics). Accordingly, the desired ADC 144 for each input signal may be selected by installing an appropriate ADC daughter board 104. Is some embodiments, more than one ADC may be included on a daughter board if desired.

Figure 11:
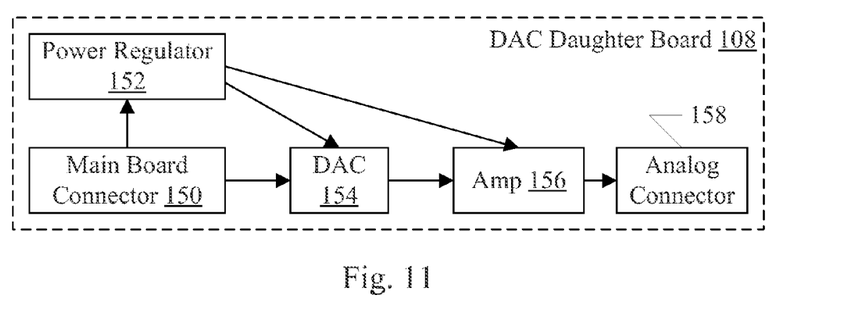
FIG. 11 is a block diagram of one embodiment of a DAC daughter board.

FIG. 11 is a block diagram of one embodiment of a DAC daughter board 108. In the illustrated embodiment, the daughter board 108 may include a main board connector 150, a power regulator 152, a DAC 154, an amplifier (amp) 156, and an analog connector 158. The main board connector 150 is coupled to the power regulator 152 and the DAC 154. The power regulator 152 is coupled to the DAC 154 and the amp 156. The amp 156 is coupled to the DAC 154 and the analog connector 158.

The main board connector 150 may be similar to the main board connector 140 and may be configured to connect to the daughter connector 120. The power regulator 152 may receive power from the main board and may generate a regulated power supply voltage for the DAC 154 and the amp 156. The analog connector 158 may be similar to the analog connector 148.

The DAC 154 may be configured to receive a stream of digital samples from the main board connector 150, and convert them to an analog output signal. The amp 156 may amplify the output signal to drive the actuator and/or the connection between the analog connector 158 and the actuator.

Different instances of the DAC daughter board 108 may have different DACs 154 (e.g. DACs with different price points and other characteristics). Accordingly, the desired DAC 154 for each output signal may be selected by installing an appropriate DAC daughter board 108. Is some embodiments, more than one DAC may be included on a daughter board if desired.

Numerous variations and modifications will become apparent to those skilled in the art once the above disclosure is fully appreciated. It is intended that the following claims be interpreted to embrace all such variations and modifications.

What is claimed is:

1. A system comprising:
  an analog sensor;
  an analog to digital converter (ADC) coupled to the analog sensor and configured to convert an analog output signal of the analog sensor to a first digital signal that comprises a plurality of samples of the analog output signal;
  a compression circuit coupled to the ADC, wherein the compression circuit is configured to:
    compress the first digital signal to generate a first compressed digital signal;
    monitor the plurality of samples in the first digital signal to detect which bits of the plurality of samples are varying from sample to sample;
    dynamically modify a format of the first compressed digital signal responsive to monitoring the plurality of samples, wherein the dynamic modification comprises excluding the unvarying bits from the first compressed digital signal; and
    communicate a modification of the format within the first compressed digital signal; and
  an integrated circuit coupled to the compression circuit, wherein the integrated circuit is configured to process the first compressed digital signal.

2. The system as recited in claim 1 further comprising:
  an analog actuator, wherein the integrated circuit is configured to generate a second compressed digital signal to control the analog actuator;
  a decompression circuit coupled to the integrated circuit, wherein the decompression circuit is configured to decompress the second compressed digital signal to generate a second digital signal;
  a digital to analog converter (DAC) coupled to the analog actuator and the decompression circuit, wherein the DAC is configured to convert the second digital signal to an analog input to the analog actuator.

3. The system as recited in claim 1 wherein the compression circuit is configured to detect that a first number of bits are varying, and to transmit an indication that only the first number of bits per sample will be transmitted.

4. The system as recited in claim 3 wherein the compression circuit is configured to detect that a second number of bits are varying, wherein the second number differs from the first number, and to transmit an indication that only the second number of bits per sample will be transmitted.

5. The system as recited in claim 1 wherein the compression circuit is configured to monitor the plurality of samples in the first digital signal to detect a repeating pattern in the plurality of samples, and wherein the first compressed digital signal includes a transmission of the pattern and an indication that the pattern is repeating.

6. The system as recited in claim 5 wherein the integrated circuit is configured to repeat the pattern of samples internally responsive to the indication.

7. The system as recited in claim 6 wherein the compression circuit is configured to terminate transmission of the first compressed digital signal responsive to transmitting the pattern.

8. The system as recited in claim 7 wherein the compression circuit is configured to detect that the pattern is broken, and wherein the compression circuit is configured to begin transmitting the first compressed digital signal responsive to detecting that the pattern is broken.

9. A method comprising:
sampling an analog input in an analog to digital converter (ADC) to generate a plurality of samples;
compressing the plurality of samples in a compression circuit, wherein the compressing comprises:
detecting that a first number of bits of the plurality of samples are varying from sample to sample; and
dynamically modifying a format of the compressed samples responsive to monitoring the plurality of samples, and wherein the compressing comprises communicating a modification of the format to an integrated circuit;
transmitting only the varying bits as the compressed plurality of samples to the integrated circuit; and
processing the plurality of samples in the integrated circuit.

10. The method as recited in claim 9 wherein the compressing further comprises:
detecting that a second number of bits are varying, wherein the second number differs from the first number; and
transmitting only the second number of bits per sample as the compressed plurality of samples.

11. The method as recited in claim 10 wherein the second number is less than the first number.

12. The method as recited in claim 10 wherein the second number is greater than the first number.

13. The method as recited in claim 9 wherein the compressing comprises
detecting a repeating pattern in the plurality of samples;
transmitting the pattern and an indication that the pattern is repeating; and
terminating transmission of the plurality of samples.

14. The method as recited in claim 13 further comprising the integrated circuit repeating the pattern of samples internally responsive to the indication.

15. The method as recited in claim 14 further comprising:
detecting that the pattern is no longer repeating; and
beginning to transmit the plurality of samples again responsive to detecting that the pattern is no longer repeating.

16. A system comprising:
an analog sensor;
an analog to digital converter (ADC) coupled to the analog sensor and configured to convert an analog output signal of the analog sensor to a first digital signal that comprises a plurality of samples of the analog output signal;
a compression circuit coupled to the ADC, wherein the compression circuit is configured to:
compress the first digital signal to generate a first compressed digital signal;
monitor the plurality of samples in the first digital signal to detect a repeating pattern in the plurality of samples;
dynamically modify a format of the first compressed digital signal responsive to monitoring the plurality of samples, wherein the format includes a transmission of the pattern and an indication that the pattern is repeating; and
an integrated circuit coupled to the compression circuit, wherein the integrated circuit is configured to process the first compressed digital signal.

17. The system as recited in claim 16 wherein the integrated circuit is configured to repeat the pattern of samples internally responsive to the indication.

18. The system as recited in claim 17 wherein the compression circuit is configured to terminate transmission of the first compressed digital signal responsive to transmitting the pattern.

19. The system as recited in claim 18 wherein the compression circuit is configured to detect that the pattern is broken, and wherein the compression circuit is configured to begin transmitting the first compressed digital signal responsive to detecting that the pattern is broken.

\* \* \* \* \*